(12) United States Patent
Mobin et al.

(10) Patent No.: US 8,693,593 B2
(45) Date of Patent: Apr. 8, 2014

(54) METHODS AND APPARATUS FOR AUTOMATIC GAIN CONTROL USING SAMPLES TAKEN AT DESIRED SAMPLING PHASE AND TARGET VOLTAGE LEVEL

(75) Inventors: Mohammad S. Mobin, Orefield, PA (US); Matthew Tota, Clinton, NJ (US); Mark Trafford, Fleetwood, PA (US)

(73) Assignee: LSI Corporation, San Jose, CA (US)

( * ) Notice: Subject to any disclaimer, the term of this patent is extended or adjusted under 35 U.S.C. 154(b) by 222 days.

(21) Appl. No.: 12/982,220

(22) Filed: Dec. 30, 2010

(65) Prior Publication Data

US 2012/0170695 A1    Jul. 5, 2012

(51) Int. Cl.
*H04L 27/06* (2006.01)
*H04B 1/06* (2006.01)

(52) U.S. Cl.
USPC .......................................... 375/345; 455/232.1

(58) Field of Classification Search
USPC ......... 375/224, 226, 316, 317, 345, 355, 371; 330/129, 127; 455/230, 232.1
See application file for complete search history.

(56) References Cited

U.S. PATENT DOCUMENTS

| | | | |
|---|---|---|---|
| 5,117,201 A * | 5/1992 | Luther ........................ | 330/279 |
| 6,356,849 B1 * | 3/2002 | Jaffe ............................ | 702/66 |
| 6,879,627 B1 * | 4/2005 | Davidson et al. .............. | 375/222 |
| 7,031,616 B2 * | 4/2006 | Eilenberger et al. .......... | 398/155 |
| 7,640,463 B2 * | 12/2009 | Windler et al. ............... | 714/707 |
| 7,649,933 B2 * | 1/2010 | Abel et al. ..................... | 375/233 |
| 7,738,605 B2 * | 6/2010 | Mobin et al. .................. | 375/345 |
| 8,074,126 B1 * | 12/2011 | Qian et al. ..................... | 714/704 |
| 8,432,960 B2 * | 4/2013 | Agrawal et al. ............... | 375/232 |
| 2002/0085656 A1 * | 7/2002 | Lee et al. ...................... | 375/355 |
| 2006/0256847 A1 * | 11/2006 | Nygaard, Jr. .................. | 375/224 |
| 2007/0147555 A1 * | 6/2007 | Mobin et al. .................. | 375/345 |
| 2007/0206176 A1 * | 9/2007 | Yang et al. .................... | 356/5.1 |
| 2011/0012644 A1 * | 1/2011 | Chiu .............................. | 327/94 |

\* cited by examiner

*Primary Examiner* — Tesfaldet Bocure
(74) *Attorney, Agent, or Firm* — Ryan, Mason & Lewis, LLP

(57) ABSTRACT

Methods and apparatus are provided for automatic gain control in a receiver using samples taken at a desired sampling phase and target voltage level. The gain of a received signal is adjusted by obtaining a plurality of samples of the received signal substantially at a desired sampling phase (such as a center of a given unit interval), wherein at least one of the samples is taken substantially at a target voltage level; comparing the plurality of samples to determine whether the received signal has an amplitude that is substantially equal to the target voltage level; and adjusting a receiver gain based on whether the received signal amplitude is substantially equal to the target voltage level. The comparison can comprise the evaluation of a logic function, such as an exclusive OR function. The comparison can be performed over a plurality of samples to obtain an average gain update decision. The receiver gain can be adjusted based on a histogram of the average gain update decision, relative to a predefined threshold.

18 Claims, 5 Drawing Sheets

METHODS AND APPARATUS FOR AUTOMATIC GAIN CONTROL USING SAMPLES TAKEN AT DESIRED SAMPLING PHASE AND TARGET VOLTAGE LEVEL

FIELD OF THE INVENTION

The present invention is related to techniques for adjusting the gain of a received signal and, more particularly, to techniques for adjusting the gain of a received signal based on samples of the received signal obtained at the desired sampling phase.

BACKGROUND OF THE INVENTION

Transmitters and receivers in many communication systems employ gain control techniques to adjust the signal levels of various amplifier stages. Analog and digital automatic gain control (AGC) circuits are well-known. For example, AGC circuits are frequently used in transmitters or receivers in the field of cellular, wireless, and spread-spectrum wireless communication systems.

The AGC function may be employed, for example, to bring a newly acquired signal at the receiver input into the dynamic range of the receiver, when a communication link is first established. Thereafter, the AGC function typically continually adjusts the overall receiver gain to compensate for fluctuations in received signal strength associated with fading, interference, or similar interruptions of the signal level.

Such gain control circuitry is often employed to maintain a constant level in the front end of a receiver, including the amplification and RF/IF demodulation stages. The constant level is maintained such that the output (demodulated) baseband signal level of the receiver remains within well-defined limits, even though many factors may vary gain levels within each component of the front end.

Typically, gain control problems were solved using analog receive signal strength detectors, rectification and averaging techniques, or other control loops based on signal amplitude or energy averaging. U.S. Pat. No. 7,738,605, entitled "Method and Apparatus for Adjusting Receiver Gain Based on Received Signal Envelope Detection," discloses techniques for adjusting receiver gain based on received signal envelope detection. The received signal is sampled, for example, using a plurality of latches, to determine the signal envelope amplitude. The receiver gain is then adjusted based on the determined signal amplitude.

Such existing envelope detection techniques have significantly improved the ability to maintain a desired level in the front end of a receiver. The disclosed techniques, however, suffer from a number of limitations, which if overcome, could further improve the performance of the AGC function in receivers. In particular, in some channel environments, envelope-based AGC processes may not provide optimal gain control when the receiver input signal is over-equalized. Generally, in the presence of an over-equalized signal, the resulting signal gain at the sampling point is reduced, thereby causing a loss of signal detection margin.

A need therefore exists for improved methods and apparatus for automatic gain control. A further need exists for techniques for adjusting the receiver gain based on samples taken at the desired sampling phase and target voltage.

SUMMARY OF THE INVENTION

Generally, methods and apparatus are provided for automatic gain control in a receiver using samples taken at a desired sampling phase and target voltage level. According to one aspect of the invention, the gain of a received signal is adjusted by obtaining a plurality of samples of the received signal substantially at a desired sampling phase (such as a center of a given unit interval), wherein at least one of the samples is taken substantially at a target voltage level; comparing the plurality of samples to determine whether the received signal has an amplitude that is substantially equal to the target voltage level; and adjusting a receiver gain based on whether the received signal amplitude is substantially equal to the target voltage level. The comparison can comprise the evaluation of a logic function, such as an exclusive OR function, on the sample values.

In one implementation, the comparison is performed over time to obtain an average gain update decision. The receiver gain can be increased, for example, when the receiver amplitude, on average, is less than the target amplitude value. Likewise, the receiver gain can be decreased when the receiver amplitude, on average, is greater than the target amplitude value.

A more complete understanding of the present invention, as well as further features and advantages of the present invention, will be obtained by reference to the following detailed description and drawings.

DETAILED DESCRIPTION

The present invention provides improved methods and apparatus for automatic gain control. According to one aspect of the invention, the receiver gain is adjusted based on samples taken at the desired sampling phase and target voltage level. In one exemplary implementation, a target voltage level is evaluated using samples taken by a plurality of latches that are sampled with the sampling clock phase, such as a decision latch and two error latches. In an exemplary embodiment, at least one of the error latches takes samples at the target voltage level. Since the samples are taken at the desired signal sampling phase and target voltage level, the outer eye envelope (i.e., maximum signal amplitude) does not impair the AGC decision, as with conventional techniques.

Figure 1:
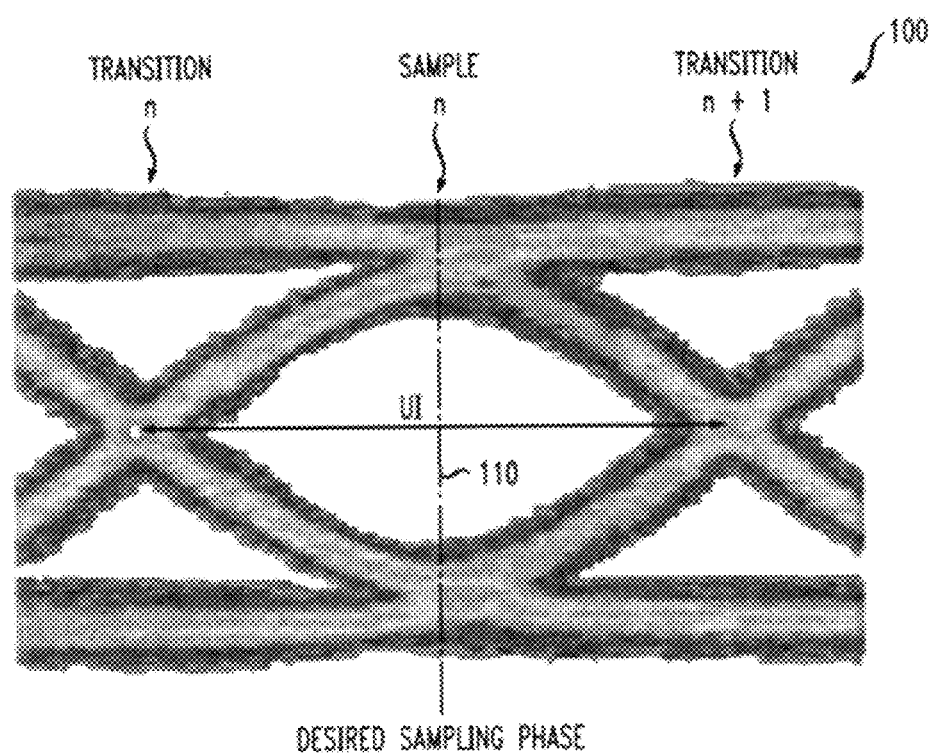
FIG. 1 illustrates a conventional data stream histogram associated with received data.

FIG. 1 illustrates the transitions of a data stream histogram 100. As shown in FIG. 1, the data is sampled substantially in the middle of a unit interval (UI) between two transition points, at a desired sampling phase 110. Generally, the transition and sampling phases generated by the clock and data recovery (CDR) system are adjusted to align with the transitions and sample points, respectively, in the received signal at any desired voltage and phase. Thus, the internal clock is typically delayed so that the data sampling is adjusted to the center of the "data eye," in a known manner. Such uniformly spaced transition and data sampling clock phases are generally considered useful under "ideal" circumstances.

Figure 2:
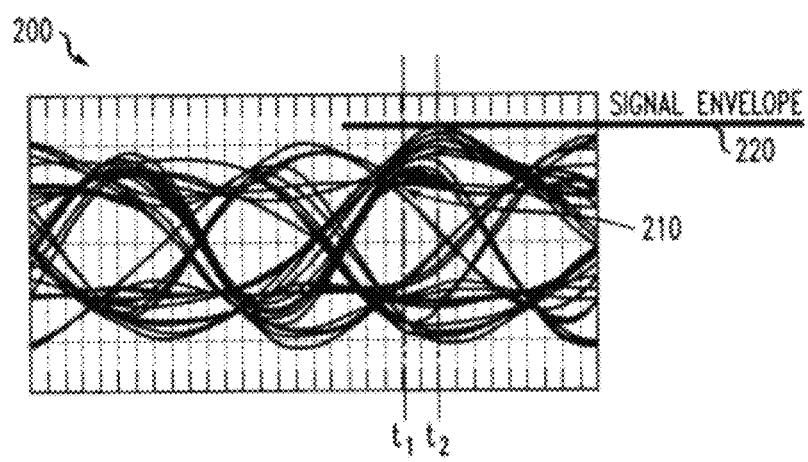
FIG. 2 illustrates a data stream histogram for received data where the received signal gain is adjusted based on detection of a signal envelope.

FIG. 2 illustrates a data stream histogram 200 for received data where the received signal gain is adjusted based on detection of a signal envelope 220. Generally, with conventional enveloped-based AGC methods, the measured envelope (i.e., the measured maximum amplitude) is substantially equal to the target voltage level, resulting in the reduction of the signal voltage noise margin for high frequency signals. For a more detailed discussion of such existing envelope-based AGC techniques, see U.S. Pat. No. 7,738,605, entitled "Method and Apparatus for Adjusting Receiver Gain Based on Received Signal Envelope Detection," incorporated by reference herein. Generally, the receiver gain is adjusted based on the determined signal amplitude. The maximum signal envelope 220 occurs at a time, $t_2$. As discussed above in conjunction with FIG. 1, the data is sampled substantially in the middle between two transition points, at a desired sampling phase ($t_1$) 210.

The present invention recognizes that, in some channel environments, envelope-based AGC processes may not provide optimal gain control when the receiver input signal is over-equalized. An envelope-based AGC process will adjust the signal gain based on the outer eye of the signal (i.e., based on the maximum signal amplitude 220). As a result, the signal at sampling point 210 will be set below the desired target signal level. Generally, in the presence of an over-equalized signal, the resulting signal gain at the sampling point 210 is reduced, thereby causing a loss of signal detection margin. The amplitude and corresponding signal margin matter most, however, at the sampling point 210. For example, in a short channel environment, if the signal is de-emphasized, the signal envelope 220 will be dominated by the de-emphasis signal.

As indicated above, according to one aspect of the invention, the receiver gain is adjusted based on samples taken at the desired sampling phase 210 and target voltage level. In one exemplary implementation, a target voltage level is compared to samples taken by a plurality of latches that are sampled with the sampling clock phase, such as a decision latch at a predefined voltage level and two error latches at the target voltage levels (such as upper and lower target voltage levels). Since the samples are taken at the desired signal sampling phase and target voltage level, the outer eye signal envelope 220 does not impair the AGC decision, as with conventional techniques.

Figure 3:
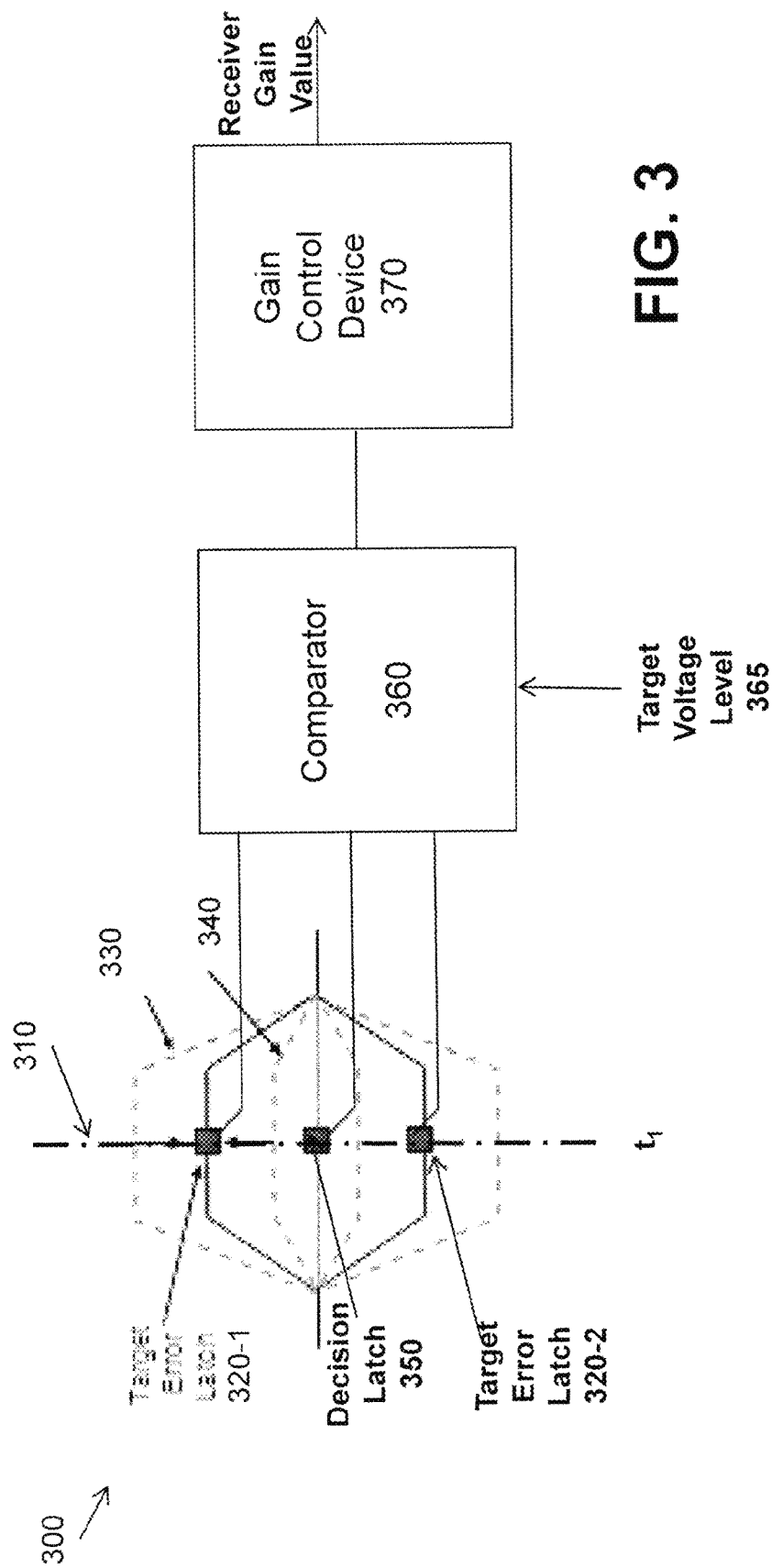
FIG. 3 illustrates an exemplary set of latches that may be employed for automatic gain control in accordance with the present invention.

FIG. 3 illustrates an exemplary set of latches that may be employed for automatic gain control in accordance with the present invention. As discussed further below in conjunction with FIG. 5, an exemplary AGC process 500 sets a target voltage level and calculates an average or root mean square (RMS) value of an exclusive OR (XOR) function between the samples measured by the decision latch 350 and one or more target error latches 320. As indicated above, the present invention obtains the samples using at least one target error latch 320 at the desired sampling phase ($t_1$) 310 and target voltage level. The decision samples are taken by the decision latch 350 at desired sampling phase ($t_1$) 310 and a predefined voltage level (such as 0V).

The present invention recognizes that when the input signal amplitude is too large, the resultant gain compression distorts the signal. Likewise, when the input signal amplitude is too small, the receiver loses signal detection margin. The disclosed AGC process 500 maintains the signal level at a substantially optimal target operating range. Generally, the disclosed AGC process 500 decreases the receiver gain when the samples obtained by the target error latch 320 indicate that the input signal amplitude is larger than the established target value, such as the envelope 330. Likewise, the disclosed AGC process 500 increases the receiver gain when the samples obtained by the target error latch 320 indicate that the input signal amplitude is smaller than the established target value, such as the envelope 340. In one exemplary embodiment, a pair of error latches 320-1 and 320-2 is employed per data eye to measure the current signal amplitude at the upper and lower target voltage levels, respectively.

Generally, if the top error latch 320-1 agrees with a decision latch 350, the signal amplitude (such as the top portion of envelope 330) is above the target voltage level and the gain must be reduced. If the top error latch 320-1 does not agree with a decision latch 350, the signal amplitude (such as the top portion of envelope 340) is below the target voltage level and must be increased. Likewise, if the bottom error latch 320-2 agrees with the decision latch 350, the signal amplitude (such as the bottom portion of envelope 330) is below the negative target voltage level and the gain must be reduced. If the bottom error latch 320-2 does not agree with the decision latch 350, the signal amplitude (such as the bottom portion of envelope 340) is above the negative target level and the in must be increased. The matching of the error latches 320-1, 320-2 and the decision latch 350 can be evaluated, for example, using an exclusive OR (XOR) function.

As discussed further below, in an exemplary embodiment, the gain adjustment decisions are based on an average gain update decision taken over a plurality, N, of samples. When the target error latch 320-1, 320-2, on average, matches the decision latch 350 over N samples, the gain exceeds the desired level and must be reduced. Likewise, when the error latch 320-1, 320-2, on average, does not match the decision latch 350 over N samples, the gain is below the desired level and must be increased. A convergence of the gain adaptation occurs when the high/low gain indicator stops showing a steady increase or decrease and starts to randomly increase and decrease the gain, in accordance with the pattern statistics.

In an exemplary embodiment, the average gain update decision is expressed as follows:

$$AGC_{update} = \Sigma_1^N L_E \oplus L_D,$$

where $L_E$ is the sample taken by the error latch 320-1, 320-2, $L_D$ is the sample taken by the decision latch 350, and $\oplus$ indicates the exclusive OR function. In an exemplary embodiment, discussed further below in conjunction with FIG. 4, the average gain update decision will vary over a range from 0 to N, and will have a target value of N/2 when the gain is optimized. The average gain update decision will have a minimum value of 0 when all N samples do not match. The average gain update decision will have a maximum value of N when all N samples match. When the average gain update decision is above N/2, the gain must be increased. When the average gain update decision is below N/2, the gain must be decreased. It is noted that the average gain update decision can be based on a comparison of the decision latch 350 with the top error latch 320-1 and/or the bottom error latch 320-2.

The target voltage level can be programmed based on a desired voltage level at a receiver.

As shown in FIG. 3, the sample values of the received signal from the exemplary latches 320-1, 320-2 and 350 are applied to a comparator 360 that compares the sample values to determine whether the received signal has an amplitude that is substantially equal to a target voltage level 365. In addition, a gain control device 370 adjusts a receiver gain value based on whether the received signal amplitude is substantially equal to the target voltage level 365.

Figure 4:
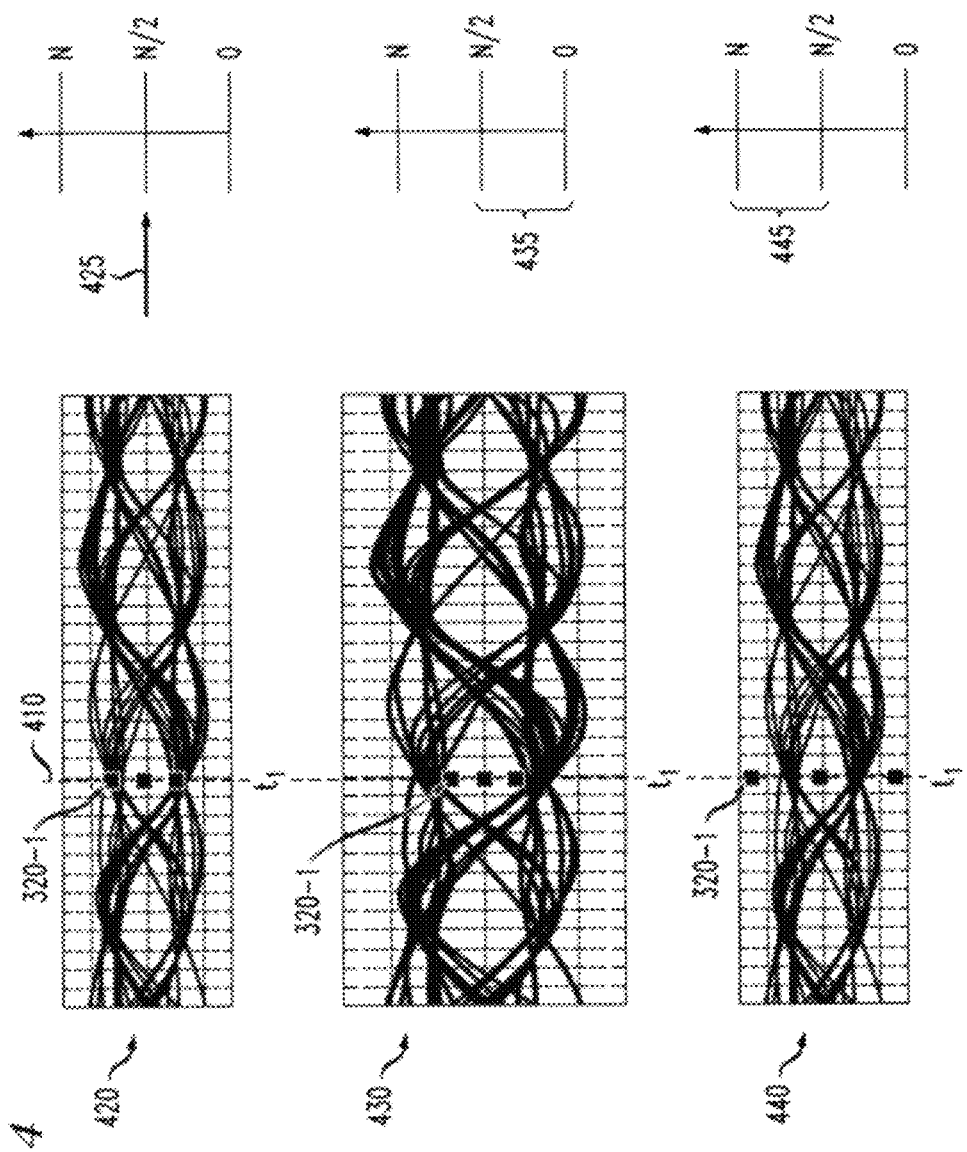
FIG. 4 illustrates a collection of data stream histograms and corresponding average gain update decisions for the received data for a number of different relationships between the measured signal amplitude and the established target voltage level.

FIG. 4 illustrates a collection of data stream histograms 420, 430, 440 for the received data for a number of different relationships between the measured signal amplitude and the target voltage level set by the error latches 320. Data stream histogram 420 corresponds to a desired AGC optimized signal, where the average signal amplitude is substantially equal to the established target voltage level at the desired sampling phase ($t_1$). In addition, FIG. 4 illustrates the average gain update decision 425 (over N samples) that corresponds to the histogram 420. Since the histogram 420 corresponds to an AGC optimized signal, the average gain update decision 425 is substantially close to N/2 and there are no gain adjustments needed.

Data stream histogram 430 corresponds to an average signal amplitude being larger than the established target voltage level at the desired sampling phase ($t_1$). The average gain update decision 435 (over N samples) that corresponds to the histogram 430 is in a range below N/2. Thus, the disclosed AGC process 500 will decrease the receiver gain, since the samples obtained by the target error latches 320 indicate, on average, that the input signal amplitude is larger than the desired target voltage value.

Data stream histogram 440 corresponds to an average signal amplitude being smaller than the established target voltage level at the desired sampling phase ($t_1$). The average gain update decision 445 (over N samples) that corresponds to the histogram 440 is in a range above N/2. Thus, the disclosed AGC process 500 will increase the receiver gain, since the samples obtained by the target error latches 320 indicate, on average, that the input signal amplitude is smaller than the established target value.

Intuitively, when the error latch 320-1, 320-2 matches the decision latch 350, such as both values measuring a binary value of "1", the exclusive OR decision will be "0." Thus, the average gain update decision 435 over N samples is positioned towards the bottom of the range of values.

Figure 5:
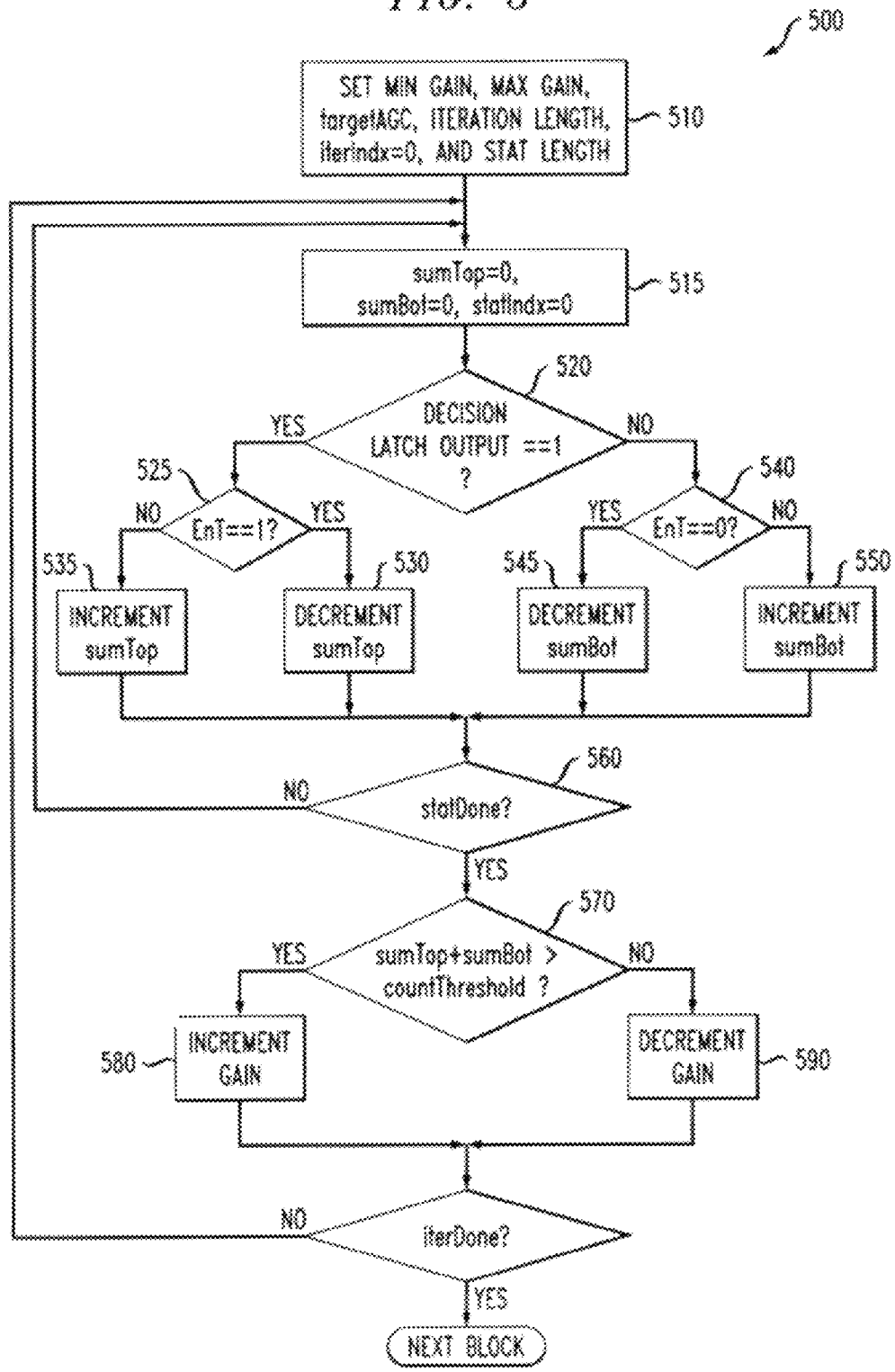
FIG. 5 is a flow chart describing an exemplary implementation of an AGC process incorporating features of the present invention.

FIG. 5 is a flow chart describing an exemplary implementation of an AGC process 500 incorporating features of the present invention. As shown in FIG. 5, the exemplary AGC process 500 initializes a minimum AGC gain, maximum AGC gain, target AGC, iteration length, iteration index, and Stat Length values during step 510. The statistics gathering is done over the defined Stat Length period. The AGC iteration is performed over a defined iteration length period.

In addition, counters sumTop, sumBot and statIndx are initialized to a value of 0 during step 515. The counters sumTop and sumBot count the number of times the decision latch does not match the top error latch 320-1 and bottom error latch 320-2, respectively.

A test is performed during step 520 to determine if the decision latch 350 measures a binary value of 1. If it is determined during step 520 that the decision latch 350 measures a binary value of 1, then the process 500 evaluates the top portion of the eye during steps 525, 530, 535. A further test is performed during step 525 to determine if the top error latch 320-1 also measures a binary value of 1. If it is determined during step 525 that the top error latch 320-1 measures a binary value of 1 (matching the decision latch 350), then the sumTop counter is decremented during step 530. If, however, it is determined during step 525 that the top error latch 320-1 measures a binary value of 0 (mismatching the decision latch 350), then the sumTop counter is incremented during step 535.

If, however, it is determined during step 520 that the decision latch 350 measures a binary value of 0, then the process 500 evaluates the bottom portion of the eye during steps 540, 545, 550. A further test is performed during step 540 to determine if the bottom error latch 320-2 also measures a binary value of 0. If it is determined during step 540 that the bottom error latch 320-1 measures a binary value of 0 (matching the decision latch 350), then the sumBot counter is decremented during step 545. If, however, it is determined during step 540 that the top error latch 320-1 measures a binary value of 1 (mismatching the decision latch 350), then the sumBot counter is incremented during step 550.

A test is performed during step 560 to determine if statistics gathering phase is complete. If it is determined during step 560 that the statistics gathering phase is complete, then a further test is performed during step 570 to determine if the sum of the sumTop and sumBot counters exceeds a predefined count threshold, such as a count threshold of 0. In other words, the test performed during step 570 is determining whether the "do not match" counter exceeds a specified threshold. As indicated above, when the error and decision latch samples do not match, on average, the gain must be increased. The count threshold value determines whether the signal level is considered above or below the target signal level. If it is determined during step S70 that the sum of the sumTop and sumBot counters exceed the predefined count threshold, then the receiver gain is increased during step S80. If, however, it is determined during step S70 that the sum of the sumTop and sumBot counters do not exceed the predefined count threshold, then the receiver gain is decreased during step S90. The gain adjustments performed during steps 580 and 590 can optionally be saturated by maximum and minimum gain values.

In a further variation, the receiver gain can be adjusted only when the deviation from the established threshold exceeds a predefined range or threshold. The predefined range or threshold may be established, for example, based on historical data, such as a hysteresis.

Among other benefits, the DFE equalizer can use the target AGC error latch threshold for the DFE error latch threshold. In addition, the two error latches 320-1, 320-2 can be shared with the DFE operation. Thus, the latches used by the AGC process 500 do not incur additional system costs.

While the present invention is illustrated in the context of a transceiver environment, the disclosed AGC techniques can be applied in any receiver environment, as would be apparent to a person of ordinary skill in the art.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for adjusting a gain of a received signal, comprising:
    obtaining a plurality of samples of said received signal substantially at a desired sampling phase, wherein at least one of said samples is taken substantially at a target voltage level;
    comparing said plurality of samples to determine whether said received signal has an amplitude that is substantially equal to said target voltage level;
    obtaining a histogram of an average gain update decision over said plurality of samples based on said comparison; and
    adjusting a receiver gain based on whether said received signal amplitude is substantially equal to said target voltage level based on said histogram.

2. The method of claim 1, wherein said desired sampling phase is substantially in a center of a given unit interval.

3. The method of claim 1, wherein said comparing step comprises the step of evaluating a logic function.

4. The method of claim 3, wherein said logic function is an exclusive OR function.

5. The method of claim 1, wherein said comparing step is performed over a plurality of samples.

6. The method of claim 1, wherein said adjusting step further comprises the step of decreasing said receiver gain when said amplitude is greater than said target amplitude value.

7. The method of claim 1, wherein said adjusting step further comprises the step of increasing said receiver gain when said amplitude is less than said target amplitude value.

8. The method of claim 1, wherein said receiver gain is increased when said histogram of said average gain update decision is above a predefined threshold.

9. The method of claim 1, wherein said receiver gain is decreased when said histogram of said average gain update decision is below a predefined threshold.

10. A circuit for adjusting a gain of a received signal, comprising:
    a plurality of latches for obtaining a plurality of samples of said received signal substantially at a desired sampling phase, wherein at least one of said samples is taken substantially at a target voltage level; and
    a logic circuit for comparing said plurality of samples to determine whether said received signal has an amplitude that is substantially equal to said target voltage level, wherein an output of said logic circuit is processed to obtain a histogram of an average gain update decision; and
    a gain control device for adjusting a receiver gain based on whether said received signal amplitude is substantially equal to said target voltage level based on said histogram.

11. The gain adjusting circuit of claim 10, wherein said desired sampling phase is substantially in a center of a given unit interval.

12. The gain adjusting circuit of claim 10, wherein said logic circuit implements an exclusive OR function.

13. The gain adjusting circuit of claim 10, wherein said logic circuit performs said comparison over a plurality of samples.

14. The gain adjusting circuit of claim 10, wherein said gain control device decreases said receiver gain when said amplitude is greater than said target amplitude value.

15. The gain adjusting circuit of claim 10, wherein said gain control device increases said receiver gain when said amplitude is less than said target amplitude value.

16. The gain adjusting circuit of claim 10, wherein said receiver gain is increased when said histogram of said average gain update decision is above a predefined threshold.

17. The gain adjusting circuit of claim 10, wherein said receiver gain is decreased when said histogram of said average gain update decision is below a predefined threshold.

18. A system for adjusting a gain of a received signal, comprising:
    means for obtaining a plurality of samples of said received signal substantially at a desired sampling phase, wherein at least one of said samples is taken substantially at a target voltage level; and means for comparing said plurality of samples to determine whether said received signal has an amplitude that is substantially equal to said target voltage level;

means for obtaining a histogram of an average gain update decision over said plurality of samples based on said comparison; and means for adjusting a receiver gain based on whether said received signal amplitude is substantially equal to said target voltage level based on said histogram.

* * * * *